United States Patent
Zhao et al.

(10) Patent No.: US 10,038,391 B2
(45) Date of Patent: Jul. 31, 2018

(54) CENTRAL-STRING INVERTER DEVICE

(71) Applicant: SUNGROW POWER SUPPLY CO., LTD., Hefei, Anhui (CN)

(72) Inventors: Wei Zhao, Anhui (CN); You Lu, Anhui (CN); Tan Shen, Anhui (CN); Xiaodong Mei, Anhui (CN)

(73) Assignee: SUNGROW POWER SUPPLY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/630,118

(22) Filed: Jun. 22, 2017

(65) Prior Publication Data

US 2018/0166996 A1  Jun. 14, 2018

(30) Foreign Application Priority Data

Dec. 12, 2016  (CN) .................... 2016 2 1358025 U

(51) Int. Cl.
| | | |
|---|---|---|
| H05K 7/20 | (2006.01) | |
| H02M 7/00 | (2006.01) | |
| H05K 7/14 | (2006.01) | |
| H02J 1/10 | (2006.01) | |
| H02M 7/42 | (2006.01) | |

(52) U.S. Cl.
CPC ............ H02M 7/003 (2013.01); H02J 1/102 (2013.01); H02M 7/42 (2013.01); H05K 7/1427 (2013.01); H05K 7/20009 (2013.01)

(58) Field of Classification Search
None
See application file for complete search history.

(56) References Cited

U.S. PATENT DOCUMENTS 7,667,963 B2 *  2/2010  Illerhaus ............... H02M 7/003
                                                        361/688
2010/0302731 A1  12/2010  Belikoff et al.
2012/0077427 A1   3/2012  Wei
2012/0155027 A1   6/2012  Broome et al.
(Continued)

FOREIGN PATENT DOCUMENTS

CN     202954588 U    5/2013
CN     204167717 U    2/2015
(Continued)

OTHER PUBLICATIONS

Extended European Search Report corresponding to Application No. 17174207.5-1803; dated Jan. 3, 2018.

*Primary Examiner* — Courtney Smith
(74) *Attorney, Agent, or Firm* — Cantor Colburn LLP

(57) ABSTRACT

A central-string inverter device is provided, including a container and multiple string inverters installed in the container. The multiple string inverters are arranged in two rows located respectively on two opposite sides of the container. An intermediate duct is formed between the two rows of string inverters. An air outlet is arranged on each of side walls of the two opposite sides of the container. An air inlet is arranged on each of side walls of the other two opposite sides of the container or on a bottom wall of the container. Pulling structures corresponding to the multiple string inverters are arranged on the side walls of the two opposite sides of the container. Each string inverter is installed or removed through the pulling structure.

14 Claims, 7 Drawing Sheets

(56) References Cited

U.S. PATENT DOCUMENTS

| | | | |
|---|---|---|---|
| 2014/0167513 A1* | 6/2014 | Chang | H02J 3/385 |
| | | | 307/52 |
| 2014/0192455 A1* | 7/2014 | Yoshida | H02B 1/012 |
| | | | 361/605 |
| 2014/0301041 A1* | 10/2014 | Kitanaka | H02M 7/003 |
| | | | 361/697 |
| 2014/0319985 A1 | 10/2014 | Kikuchi et al. | |
| 2016/0037677 A1* | 2/2016 | Yamanaka | H05K 7/20918 |
| | | | 361/697 |
| 2017/0055358 A1* | 2/2017 | Aarskog | H05K 7/1432 |
| 2017/0103483 A1* | 4/2017 | Drees | G06Q 50/16 |

FOREIGN PATENT DOCUMENTS

| | | |
|---|---|---|
| GB | 2500196 A | 9/2013 |
| JP | 2013149905 A | 8/2013 |

\* cited by examiner

CENTRAL-STRING INVERTER DEVICE

CROSS REFERENCE TO RELATED APPLICATION

The present invention claims priority under 35 U.S.C. § 119 to Chinese Patent Application No. 201621358025.X, titled "CENTRAL-STRING INVERTER DEVICE", filed on Dec. 12, 2016 with the State Intellectual Property Office of the People's Republic of China, which is incorporated herein by reference in its entirety.

TECHNICAL FIELD

The present disclosure relates to an inverter, and in particular to a central-string inverter device.

BACKGROUND

In a large-scale ground power station, a container-type inverter device with a power higher than 1 MW is adopted usually. More than two high power inverters (with a power higher than 500 kW) are integrated in the container to form a central inverter device, which has advantages of easy installation, easy maintenance, small occupation, low cost and the like. Alternatively, in a large-scale ground power station, the high power inverter is directly made into an outdoor cabinet to form a single inverter device with a power higher than 1 MW. However, these two types of inverter device have a small amount of MPPTs (generally 2 to 4 MPPTs) due to design limitations, which cannot meet a requirement of multiple MPPT control for complex terrain. Thus energy yield is greatly affected.

SUMMARY

In order to address the issue of requirement for multiple MPPTs, the present disclosure provides a central-string inverter device formed by integrating multiple string inverters into a container. The number of MPPTs of this device may reach 20 or more. In addition, since the string inverters are integrated into the container, the installation, maintenance and heat radiation are a big issue. The central-string inverter device according to the present disclosure can be easily installed, maintained and is advantageous for heat radiation.

The technical solution of the present disclosure is described hereinafter. A central-string inverter device includes a container and multiple string inverters installed in the container. The multiple string inverters are arranged in two rows located respectively on two opposite sides of the container. An intermediate duct is formed between the two rows of string inverters. An air outlet is arranged on each of side walls of the two opposite sides of the container. An air inlet is arranged on each of side walls of the other two opposite sides of the container or on a bottom wall of the container. Pulling structures corresponding to the multiple string inverters are arranged on a string inverter bracket which is installed on a bottom wall of the container. Each of the string inverters is installed or removed through the corresponding pulling structure.

As a further improvement of the above solution, an isolation duct is arranged on each of the side walls of the container having the air outlet.

As a further improvement of the above solution, a maintenance door is installed on the side wall of the container having the air outlet.

Further, the air outlet is arranged on the maintenance door.

As a further improvement of the above solution, a maintenance door is installed on the side wall of the container having the air inlet.

Further, the air inlet is arranged on the maintenance door.

Even further, the maintenance door is a wire mesh door, on which meshes form the air outlet or the air inlet.

As a further improvement of the above solution, if the air inlet is arranged on the bottom wall of the container, each row of string inverters is divided into a upper region and a lower region in the arrangement direction, and a regional duct communicating with the intermediate duct is formed between the upper region and the lower region of the string inverters in the same row.

As a further improvement of the above solution, the pulling structure is in a pulling manner of sliding contact or in a pulling manner of pulley.

If the pulling structure is in the pulling manner of sliding contact, multiple sliding blocks are arranged at the bottom of each of the string inverters and a track corresponding to the sliding blocks is arranged on the string inverter bracket which is install on the bottom wall of the container; or a track is arranged at the bottom of each of the string inverters and a sliding block corresponding to the track is arranged on the string inverter bracket which is installed on the bottom wall of the container.

If the pulling structure is in the pulling manner of pulley, multiple pulleys are arranged at the bottom of each of the string inverters and a track corresponding to the pulleys is arranged on the string inverter bracket which is installed on the bottom wall of the container, or a track is arranged at the bottom of each of the string inverters and a pulley corresponding to the track is arranged on the string inverter bracket which is installed on the bottom wall of the container.

As a further improvement of the above solution, the central-string inverter device further includes an accessory device installed in the container, which is configured to assist the string inverters to operate normally.

The central-string inverter device according to the present disclosure has the following advantages.

1. Multiple string inverters are integrated into the container to form a central-string inverter device, which can achieve multiple MPPTs, so that the inverter may be adapt to more situations of power plant.

2. The isolation duct is designed for the central-string inverter device, so that hot air and cold air can be completely isolated, to avoid affection on the heat radiation of the system due to short-cut of the hot air and the cold air.

3. Installation and maintenance can be performed completely from outside without entering into the container. The use of fire passage inside the container and the resulting issues can be avoided, so that the space of the tire passage can be fully used to increase the actual usage area of the container.

4. Compared with separated string inverters, the installation and maintenance is more convenient.

5. Each of the string inverters operates independently without affecting each other. If a failure occurs in one of the string inverters, this string inverter may be maintained and replaced directly by the pulling operation, without affecting operations of the other string inverters.

DETAILED DESCRIPTION OF THE EMBODIMENTS

In order to make the objects, technical solutions and advantages of the present disclosure more clear, the present disclosure will be described in detail with reference to the accompanying drawings and embodiments. It should be understood that the specific embodiments described herein are only for the purpose of illustration and are not to be construed as the limitation of the present disclosure.

First Embodiment

Figure 1:
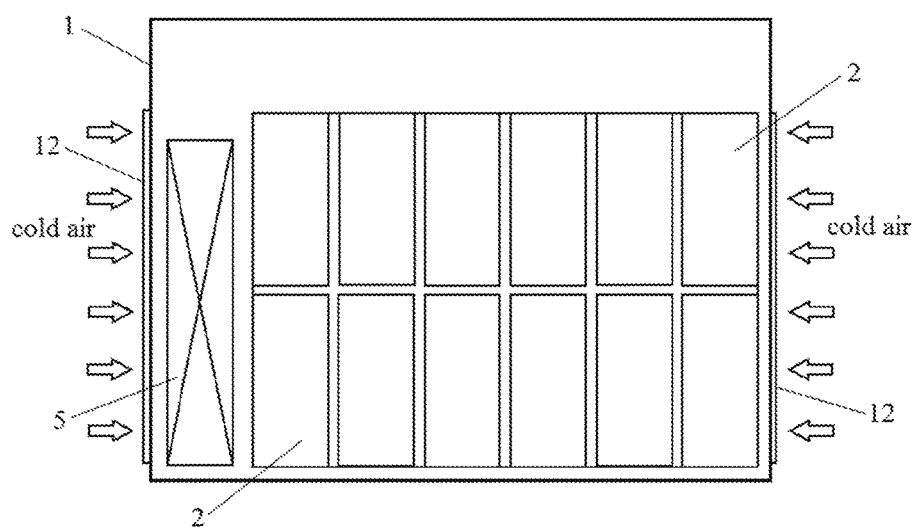
FIG. 1 is a front view of a central-string inverter device according to a first embodiment of the present disclosure.
Figure 2:
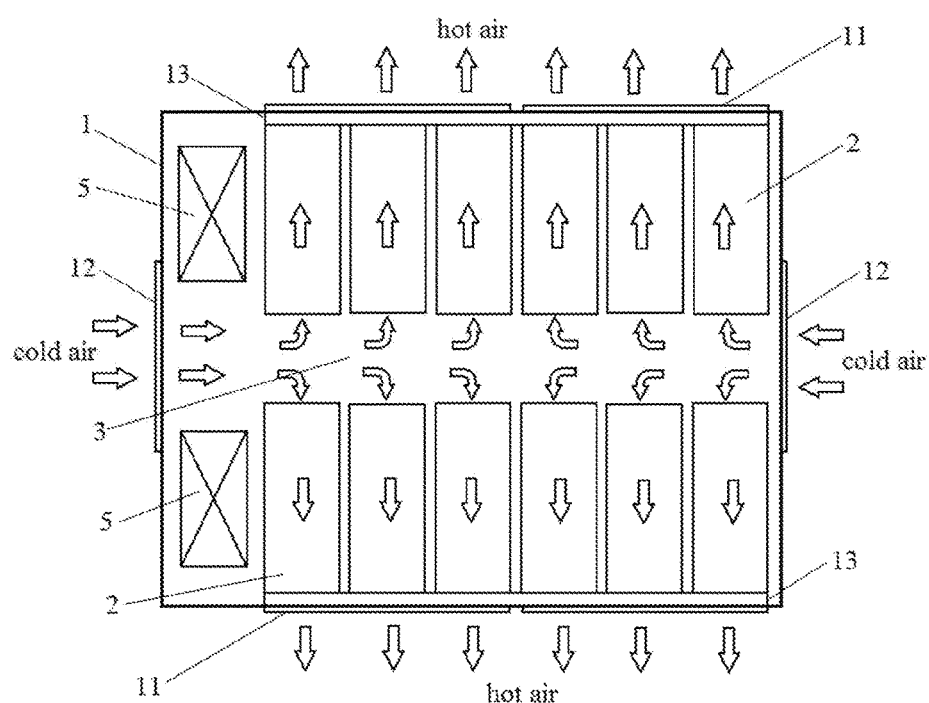
FIG. 2 is a top view of the central-string inverter device in FIG. 1.
Figure 3:
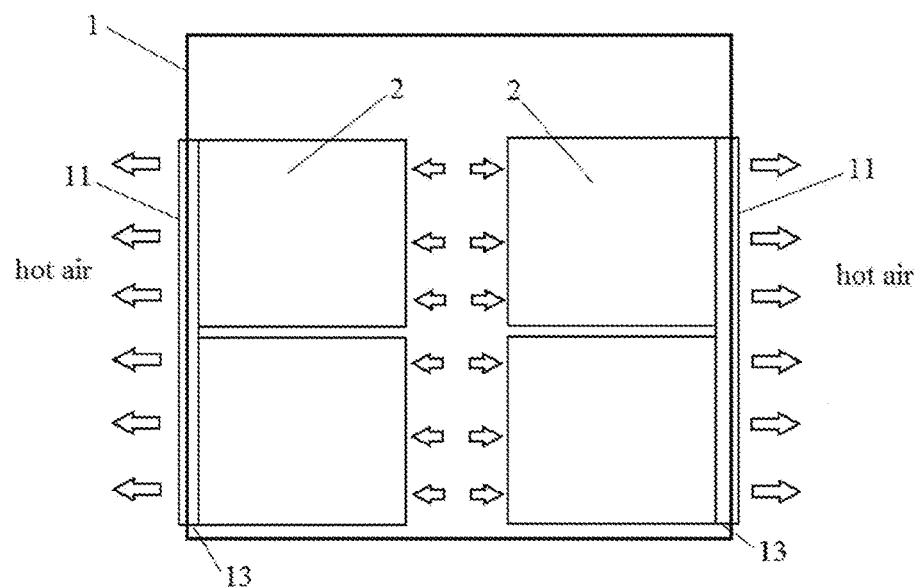
FIG. 3 is a right side view of the central-string inverter device in FIG. 1.

Referring to FIGS. 1 to 3, the central-string inverter device according to the present disclosure includes a container 1, multiple string inverters 2 and an accessory device 5. The string inverters 2 and the accessory device 5 are installed in the container 1. The accessory device 5 is configured to assist the string inverters 2 to operate normally, and may include subsidiary devices such as a switching device, a power distribution device and a communication device.

The technical solution in the present disclosure is suitable for the case of two or more string inverters, up to 20 string inverters or even more. The design for installing the string inverter 2 in the container 1 is as follows. The multiple string inverters 2 are arranged in two rows located respectively on two opposite sides of the container 1. An intermediate duct 3 is formed between the two rows of string inverters 2. An air outlet 11 is arranged on each of side walls of the two opposite sides of the container 1. An air inlet 12 is arranged on each of the other two opposite sides of the container 1. Pulling structures corresponding to the multiple string inverters 2 are arranged on the two opposite sides of the container 1. Each string inverter 2 is installed or removed through the pulling structure.

The string inverters 2 are arranged in an array on both sides of the intermediate duct 3 in the container 1. The string inverters may be stacked when needed. Therefore the string inverters may be arranged in only one layer, or in two or more layers. In the present embodiment, an example of two layers of the string inverters is described for illustration. An isolation duct 13 may be arranged on each of the side walls of the container having the air outlet 11. Incoming and outgoing wires of the string inverters 2 may be concentrated in the isolation duct 13.

Cold air enters into the container 1 from the air inlets 12 on the left and right sides of the container 1 and then passes through each of the string inverters 2 for heat radiation. After that, the air enters into the isolation duct 13. The isolation duct 13 isolates the hot air discharged from the string inverter 2 from the inner space of the container 1. The hot air is discharged directly to the outside environment of the container 1 through the isolation duct 13 and the air outlet 11.

Ducts of the string inverters 2 are separately arranged and do not affect each other. Compared with conventional inverters, each of the string inverters 2 operates independently without affecting each other. If failure occurs in one of the string inverters 2, this string inverter may be individually maintained, so that operation of the other string inverters 2 will not be affected.

Since the string inverters 2 are integrated into the container 1, the installation, maintenance and heat radiation is a big issue. Each string inverter 2 in the central-string inverter device according to the present disclosure is installed or removed through the pulling structure, so as to facilitate the installation, maintenance and heat radiation. The pulling structure may be in a pulling manner of sliding contact or in a pulling manner of pulley.

Figure 4:
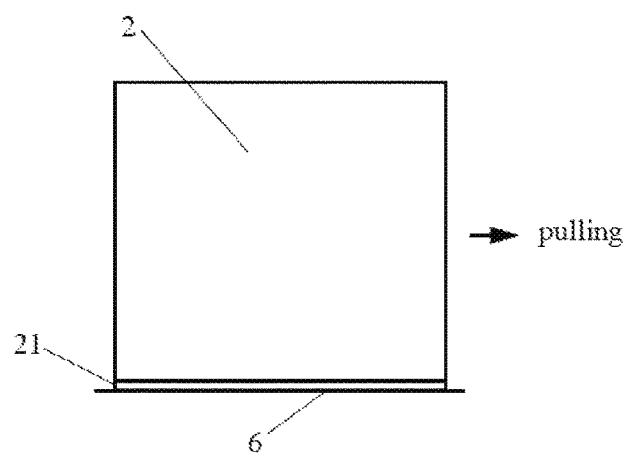
FIG. 4 is a schematic structural diagram of a pulling structure of a string inverter of the central-string inverter device in FIG. 1.

Referring to FIG. 4, the pulling structure may be in the pulling manner of sliding contact. For example, multiple sliding blocks 21 are arranged at the bottom of each string inverter 2 and a track 6 corresponding to the sliding blocks 21 is arranged on a string inverter bracket which is installed on the bottom wall of the container 1. With this pulling manner of sliding contact of the string inverters 2, the stability between the string inverters 2 and the track 6 can be improved. Apparently, the track 6 may be only provided, and the bottom surface of the string inverter 2 serves as a natural slide block. For ease of pulling, a wear-resisting slide block (e.g. made of epoxy resin) matching the track 6 may be added on the bottom of the string inverter 2, which can reduce the damage to the track 6. The track 6 may be installed on the string inverter bracket which is installed on the bottom wall of the container 1 (not shown in FIG. 4). Apparently, in other embodiments, a track may be arranged at the bottom of each string inverter 2 and a slide block corresponding to the track may be arranged on the string inverter bracket which is installed on the bottom wall of the container 1.

Figure 5:
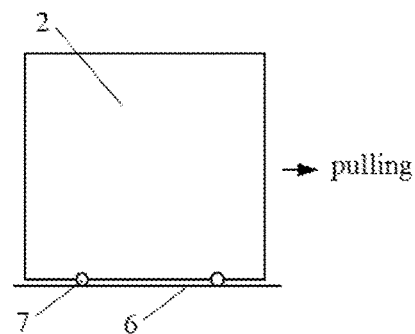
FIG. 5, similar to FIG. 4, is a schematic structural diagram of another pulling structure.

Referring to FIG. 5, the pulling structure may be in the pulling manner of pulley. For example, a pulley 7 is arranged at the bottom of each string inverter 2 and a track 6 corresponding to the pulley 7 is arranged on the string inverter bracket which is installed on the bottom wall of the container 1. Apparently, the track 6 may not be provided. Alternatively, a track may be arranged on the bottom of each string inverter 2 and a pulley corresponding to the track may be arranged on the string inverter bracket which is installed on the bottom wall of the container 1. With this pulling manner of pulley, the pulling is more convenient. By installing multiple pulleys 7 corresponding to the track 6 on the bottom of the string inverter 2, sliding movement is changed into rolling movement, which greatly reduces friction for pulling, making pulling maintenance more convenient.

Second Embodiment

Figure 6:
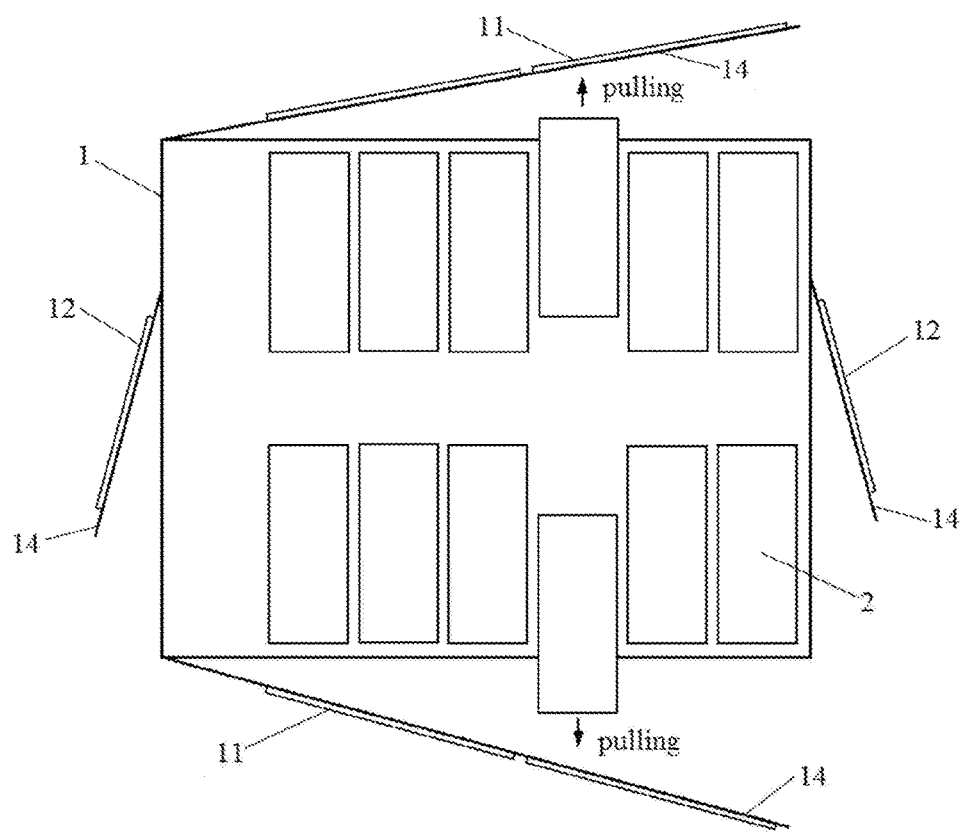
FIG. 6 is a top view of a central-string inverter device according to a second embodiment of the present disclosure.

Referring to FIG. 6, the central-string inverter device according to the second embodiment is basically the same as the central-string inverter device according to the first embodiment. The difference lies in that, in the central-string inverter device according to the second embodiment, maintenance doors 14 are installed on the side wall of the container 1 having the air outlet 11 and on the side wall of the container 1 having the air inlet 12. Preferably, the air inlet 12 and the air outlet 11 are arranged on the corresponding maintenance door 14.

The number of maintenance doors 14 may be determined according to actual need. A front maintenance door on a front side, a rear maintenance door on a rear side, a right maintenance door on a right side and a left maintenance door on a left side may be provided. Alternatively, only one of the above maintenance doors may be provided. When installing or maintaining, the front and rear maintenance doors are opened, the string inverter 2 is installed on the string inverter bracket (not shown in figure) inside the container 1 by means of pulling, or a string inverting is pulled out to perform maintenance such as overhaul. In this way, installation, wiring, operation and maintenance of the string inverters 2 may be performed by opening the front or rear maintenance door without entering into the container 1.

Third Embodiment

Figure 7:
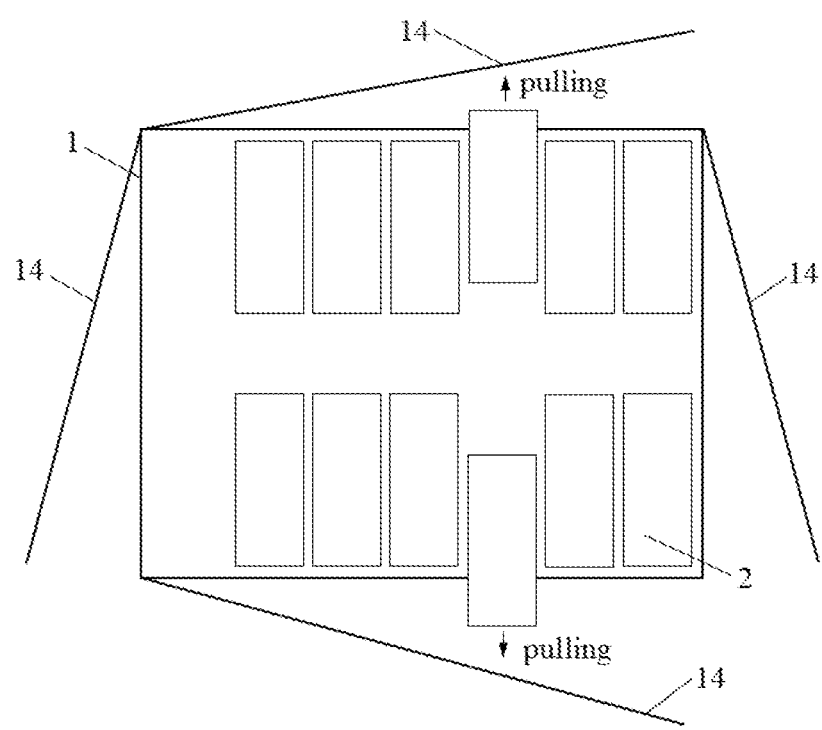
FIG. 7 is a top view of a central-string inverter device according to a third embodiment of the present disclosure.

Referring to FIG. 7, the central-string inverter device according to the third embodiment is basically the same as the central-string inverter device according to the second embodiment. The difference lies in that, in the central-string inverter device according to the third embodiment, the maintenance door 14 is a wire mesh door, on which meshes forms the air outlet 11 or the air inlet 12.

In order to meet different needs, for example, if the string inverter 2 has a high ingress protection level (such as IP55 or above), a low ingress protection may be adopted for the container 1. As shown in FIG. 7, the wire mesh door design may be adopted to meet the outdoor requirement. The isolate duct 13 may not be arranged for air exhaust of the string inverter. Hot air passes through the mesh of the wire mesh door and is discharged directly to the outside environment. The string inverter 2 is maintained in a manner as described in the above embodiment. The container 1 does not need the isolation duct 13, air outlet 11, air inlet 12 and other structural parts, thereby saving the cost.

Fourth Embodiment

Figure 8:
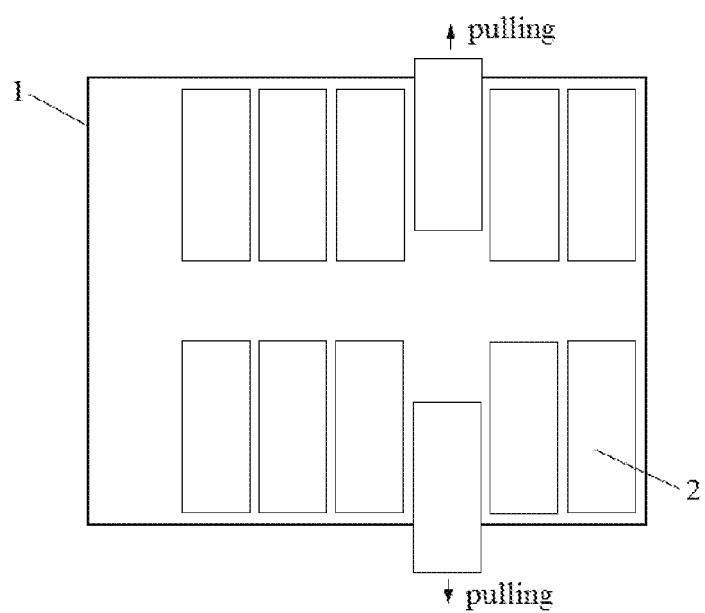
FIG. 8 is a top view of a central-string inverter device according to a fourth embodiment of the present disclosure.

Referring to FIG. 8, the wire mesh door is removed on the basis of the third embodiment. The periphery of the container 1 is completely open, and only a top and a bottom of the container 1 are left, which further saves cost and makes the installation and maintenance more convenient.

Fifth Embodiment

Figure 9:
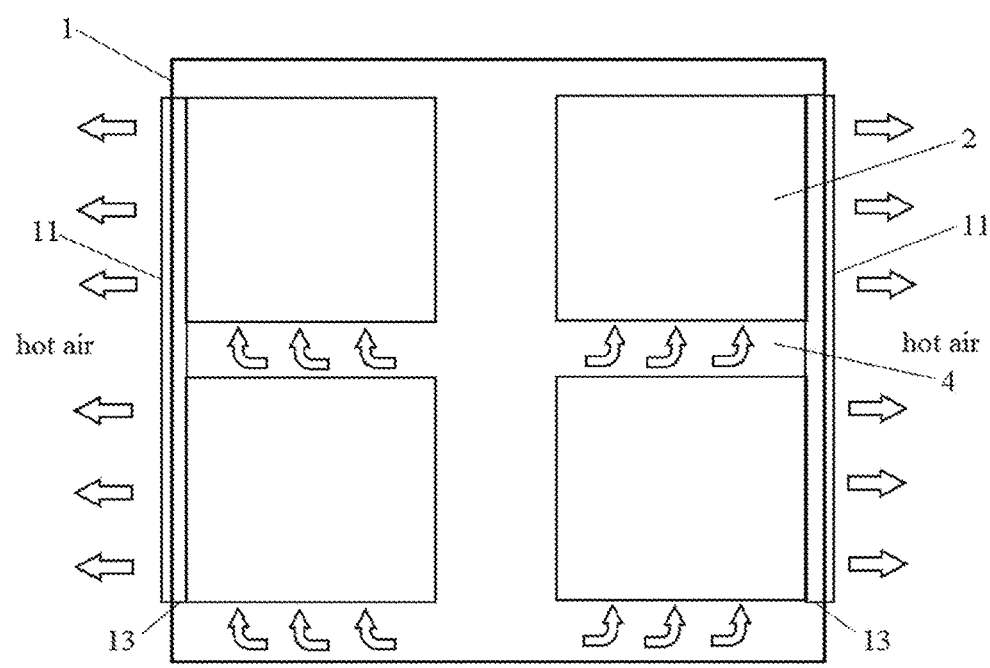
FIG. 9 is a right view of a central-string inverter device according to a fifth embodiment of the present disclosure.

Referring to FIG. 9, the central-string inverter device according to the fifth embodiment is basically the same as the central-string inverter device according to the first embodiment. The difference lies in that, in the central-string inverter device according to the fifth embodiment, the air inlet 12 is arranged on the bottom wall of the container 1.

In the case that the air inlet 12 is arranged on the bottom wall of the container 1, each row of string inverters 2 is divided into a upper region and a lower region in the arrangement direction, and a regional duct 4 communicating with the intermediate duct 3 is formed between the upper region and the lower region of the string inverters 2 in the same row. The way that air inlet is arranged on the bottom of the string inverter and the air outlet is arranged on side of the string inverter set is also convenient for incoming and outgoing of wind. Understandably, the device according to the second embodiment, the third embodiment and the fourth embodiment may also be modified in the manner that the air inlet is arranged on the bottom.

In view of the above embodiments, in the present disclosure, multiple string inverters 2 are integrated into the container 1 in an array, thereby meeting the requirement of multiple MPPT control. The isolation duct 13 is adopted in the heat irradiation duct of the present disclosure for isolating the cold hair and hot air. Maintenance can be performed from outside without entering into the container, and the thus tire passage can be omitted. Each of the string inverters 2 operates independently without affecting each other, which is convenient for maintenance.

The above only describes preferred embodiment of the present disclosure and is not to limit the present disclosure. Any changes, equivalents and modifications which are made within the spirit and principle of the present disclosure shall fall within the protection scope of the present disclosure.

The invention claimed is:

1. A central-string inverter device, comprising
a container, and
a plurality of string inverters installed in the container, wherein
the plurality of string inverters are arranged in two rows located respectively on two opposite sides of the container;
an intermediate duct is formed between the two rows of string inverters;
an air outlet is arranged on each of side walls of the two opposite sides of the container,
an air inlet is arranged on each of side walls of the other two opposite sides of the container or on a bottom wall of the container;
pulling structures corresponding to the plurality of string inverters are arranged on a string inverter bracket which is installed on a bottom wall of the container, each of the string inverters is installed or removed through the corresponding pulling structure.

2. The central-string inverter device according to claim 1, wherein an isolation duct is arranged on each of the side walls of the container having the air outlet.

3. The central-string inverter device according to claim 1, wherein a maintenance door is installed on the side wall of the container having the air outlet.

4. The central-string inverter device according to claim 3, wherein the air outlet is arranged on the maintenance door.

5. The central-string inverter device according to claim 1, wherein a maintenance door is installed on the side wall of the container having the air inlet.

6. The central-string inverter device according to claim 5, wherein the air inlet is arranged on the maintenance door.

7. The central-string inverter device according to claim 3, wherein the maintenance door is a wire mesh door, on which meshes form the air outlet or the air inlet.

8. The central-string inverter device according to claim 5, wherein the maintenance door is a wire mesh door, on which meshes form the air outlet or the air inlet.

9. The central-string inverter device according to claim 1, wherein, if the air inlet is arranged on the bottom wall of the container, each row of string inverters is divided into a upper region and a lower region in the arrangement direction, and a regional duct communicating with the intermediate duct is formed between the upper region and the lower region of the string inverters in the same row.

10. The central-string inverter device according to claim 1, wherein the pulling structure is in a pulling manner of sliding contact; and a plurality of sliding blocks are arranged at the bottom of each of the string inverters and a track corresponding to the sliding blocks is arranged on the string inverter bracket which is install on the bottom wall of the container.

11. The central-string inverter device according to claim 1, wherein the pulling structure is in a pulling manner of sliding contact; and a track is arranged at the bottom of each of the string inverters and a sliding block corresponding to the track is arranged on the string inverter bracket which is install on the bottom wall of the container.

12. The central-string inverter device according to claim 1, wherein the pulling structure is in a pulling manner of pulley; and a plurality of pulleys are arranged at the bottom of each of the string inverters and a track corresponding to the pulleys is arranged on the string inverter bracket which is install on the bottom wall of the container.

13. The central-string inverter device according to claim 1, wherein the pulling structure is in a pulling manner of pulley; and a track is arranged at the bottom of each of the string inverters and a pulley corresponding to the track is arranged on the string inverter bracket which is install on the bottom wall of the container.

14. The central-string inverter device according to claim 1, wherein the central-string inverter device further comprises an accessory device installed in the container, which is configured to assist the string inverters to operate normally.

* * * * *